US008030970B2

(12) United States Patent
Duflot

(10) Patent No.: US 8,030,970 B2
(45) Date of Patent: Oct. 4, 2011

(54) DEVICE FORMING A LOGIC GATE FOR DETECTING A LOGIC ERROR

(75) Inventor: Loïc Duflot, Noisy-le-Grand (FR)

(73) Assignee: Etat Francais, reprsenté par le Secretariat General de la Defense Nationale (FR)

( * ) Notice: Subject to any disclaimer, the term of this patent is extended or adjusted under 35 U.S.C. 154(b) by 82 days.

(21) Appl. No.: 11/921,527

(22) PCT Filed: Jun. 6, 2006

(86) PCT No.: PCT/EP2006/062917
§ 371 (c)(1),
(2), (4) Date: Jun. 26, 2009

(87) PCT Pub. No.: WO2006/131514
PCT Pub. Date: Dec. 14, 2006

(65) Prior Publication Data
US 2009/0302883 A1    Dec. 10, 2009

(30) Foreign Application Priority Data

Jun. 9, 2005 (FR) ...................................... 05 05854

(51) Int. Cl.
*H03K 19/20* (2006.01)
(52) U.S. Cl. ............... 326/104; 326/103; 326/9; 326/14
(58) Field of Classification Search .................. 326/104, 326/119, 121, 122, 8–9, 59–60
See application file for complete search history.

(56) References Cited

U.S. PATENT DOCUMENTS

| 4,947,105 | A | | 8/1990 | Unger et al. | |
|---|---|---|---|---|---|
| 5,043,604 | A | * | 8/1991 | Komaki | 326/73 |
| 5,187,392 | A | | 2/1993 | Allen | |
| 5,365,123 | A | * | 11/1994 | Nakase et al. | 326/109 |
| 5,491,432 | A | * | 2/1996 | Wong et al. | 326/86 |
| 5,585,744 | A | * | 12/1996 | Runas et al. | 326/86 |
| 7,372,303 | B2 | * | 5/2008 | Akiyoshi | 326/83 |
| 2004/0041612 | A1 | * | 3/2004 | Huber | 327/323 |
| 2005/0046442 | A1 | * | 3/2005 | Song | 326/30 |
| 2006/0232294 | A1 | * | 10/2006 | Song | 326/30 |
| 2007/0170954 | A1 | * | 7/2007 | Akiyoshi | 326/83 |

FOREIGN PATENT DOCUMENTS

EP    0768671    4/1997

OTHER PUBLICATIONS

International Search Report, PCT/EP2006/062917.
"Advanced Encryption Standard (AES)", Federal Information Processing Standards Publication 197, http://csrc.nist.gov/encryption/aes/index/html, Nov. 26, 2001, pp. i-iv, pp. 1-47.
Biham et al., "Differential Fault Analysis of Secret Key Cryptosystems", Proceedings of Advances in Cryptology (CRYPTO), 1997, pp. 513-525.

(Continued)

*Primary Examiner* — Shawki Ismail
*Assistant Examiner* — Jany Tran
(74) *Attorney, Agent, or Firm* — Lerner, David, Littenberg, Krumholz & Mentlik, LLP

(57) ABSTRACT

The invention relates to a device for forming an electric circuit comprising logic means (30) generating and using small signals of intermediate levels between the device supply levels and means for detecting signals leaving the small signal range.

23 Claims, 1 Drawing Sheet

OTHER PUBLICATIONS

Dusart et al., "Differential Fault Analysis on A.E.S.", Cryptology ePrint Archive 2003/010 http://www.iacr.org., Jan. 10, 2002, pp. 1-10.

Bar-El et al., "The Sorcerer's Apprentice Guide to Fault Attacks", Proceedings of Workshop on Fault Detection and Tolerance in Cryptolograph, 2004.

Sparso et al., "Principles of Asynchronous Circuits Design", 2001, Kluwer Academic Publishers, pp. 11-23.

Moore et al., "Improving Smart Card Security Using Self-Timed Circuits", Proceedings of the Eighth International Symposium on Asynchronous Circuits and Systems, 2002.

* cited by examiner

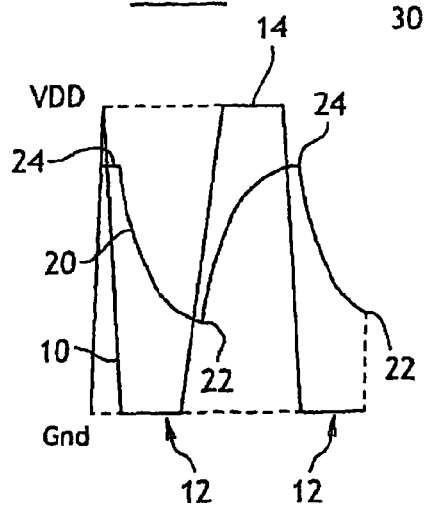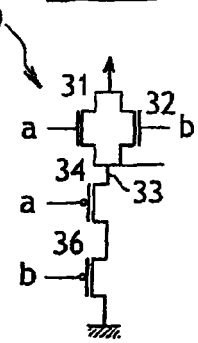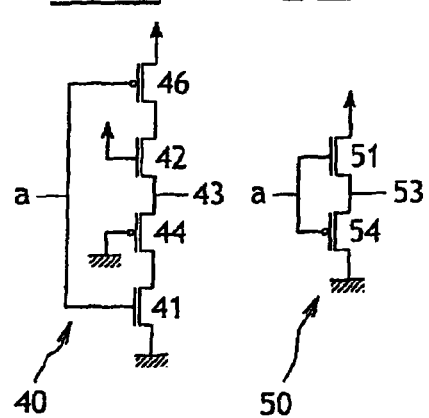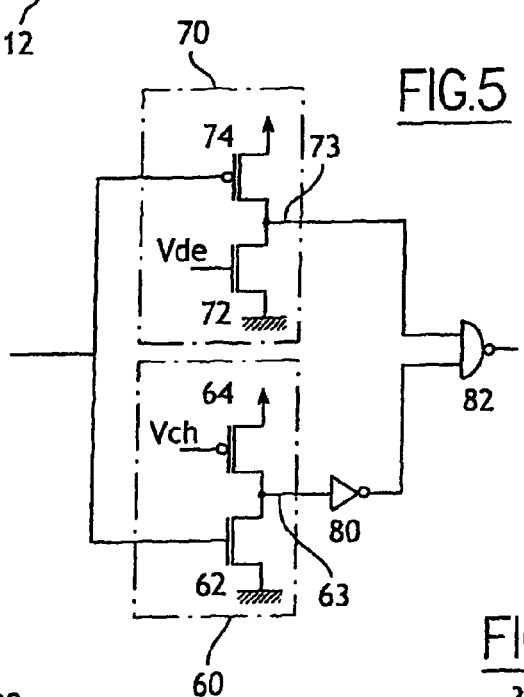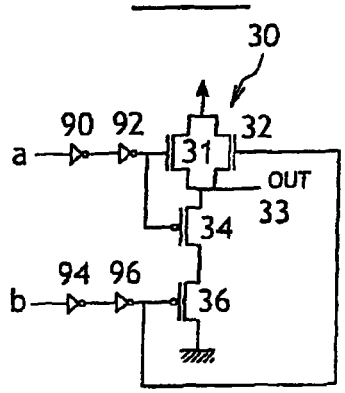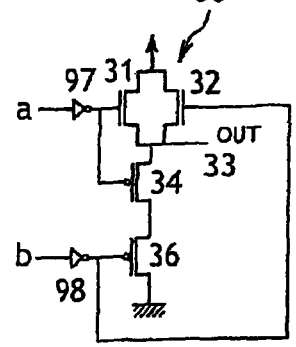

DEVICE FORMING A LOGIC GATE FOR DETECTING A LOGIC ERROR

CROSS REFERENCE TO RELATED APPLICATIONS

The present application is a national phase entry under 35 U.S.C. §371 of International Application No. PCT/EP2006/062917 filed Jun. 6, 2006, which claims priority from French Patent Application 0505854 filed Jun. 9, 2005, the disclosures of which are incorporated herein by reference.

This invention relates to the field of logic electrical circuits.

It relates more particularly to the detection of logic faults in electrical circuits. It is particularly suited to combating attacks by injecting faults intended to access data related to such circuits fraudulently.

Logic fault means a change of state of an equipotential induced by the environment of the circuit, the new equipotential state not corresponding to the logical state required regarding the state of the means which control it.

A fault can be accidental or generated deliberately by an attacker in connection with an attack by disturbances or injection of faults.

This invention is advantageously applied, but without limiting it, to devices handling a secret of the type with (a) logic circuit(s) or even to cryptographic devices of the type with (a) logic circuit(s).

Those skilled in the art are aware that the injection of (a) fault(s) into a logic circuit may be an effective means of attack for cryptographic systems.

Certain attacks by disturbances are intended to modify the internal state of a device with logic circuits to undermine its security or modify its intended function, for example by skipping an instruction or by modifying the value of a counter.

Others, such as differential attack by injecting (a) fault(s) consist of obtaining data, related for example to a confidential encryption or signature key, using a calculation based on the difference between two states of a single signal sampled at an output or a circuit node, one corresponding to the theoretical signal required in normal operation and the other to the signal generated during an injection of a fault, for example by forcing an input or a circuit node by causing it to pass from a normal logic level 0 to a forced logic level 1 or, conversely, by causing it to pass from a normal logic level 1 to a forced logic level 0.

Attacks by injecting faults are particularly effective against symmetrical algorithms of the DES or AES type ([1] National Institute of Standards and Technology (NIST): "Advanced Encryption Standard (AES)". FIPS Publication 197, (available online at csrc.nist.gov/encryption/aes/index/html, November 2001), and symmetrical algorithms such as RSA.

Those skilled in the art will find a recap concerning attacks by injection of faults in the documents [2] E. Biham and A. Shamir: "Differential Fault Analysis of secret key cryptosystems". Proceedings of Advances in Cryptology (CRYPTO), 1997 and [3] P. Dusart, G. Letourneux and O. Vivolo: "Differential Fault Analysis on AES". Cryptology ePrint Archive 2003/010 (available online at iacr.org).

Different computer security countermeasures have already been proposed for attempting to counter such attacks ([4] H. Bar-El, H. Choukri, D. Naccache, M. Tunstall and C. Whelan: "The sorcerer's apprentice guide to fault attacks". *Proceedings of Workshop on Fault Detection and Tolerance in Cryptography*, 2004).

Without being exhaustive regarding the means proposed thus far, the following means can be cited.

In the first place, computer security countermeasures based on redundancy of the logic operations carried out can be cited. It is fairly simple to repeat an operation on the basis of the same input bits and to confirm whether the two outputs thus obtained are similar or not. If the two outputs are not identical, a logic fault will be detected. However, such a proposal is not totally effective, particularly if it is difficult to ban systematically the injection of two identical faults on each of the branches of the logic operation, leading to identical outputs. Such an injection is a priori not detectable by such a device.

An alternate, but related, computer security countermeasure consists in operating random and non-systematic redundancy of certain logic operations.

Another proposed computer security countermeasure consists in calculating a logic operation twice. A first calculation is carried out based on "correct" input bits, whereas the second calculation is carried out based on complementary input bits. This countermeasure is certainly more difficult to deceive if it is fairly complex to produce two undetected faults in this case, especially if the two logic operations are performed in parallel simultaneously. However, it is not totally infallible, neither is it cost-neutral.

A variant consists in operating a combination of the countermeasures cited above, for example by performing a logic operation based on "correct" input bits four times and the same logic operation based on complementary bits three times.

Another familiar proposal consists in coding each bit relevant of the input signal using several data bits. In this case, certain combination states of the data bits are forbidden in theory. The detection of such banned states, imputed to an attack by injection of faults, leads accordingly to the generation of an alarm. On this point, asynchronous systems using a 4-phase double rail protocol can be cited (see for example [5] J. Sparso and S. Furber: "Principles of asynchronous circuits design", Kluwer academic publishers, 2001 and [6] S. Moore, R. Anderson and M. Kuhn: "Improving smartcard security using self-timed circuit technology". *IEEE International Symposium on Asynchronous Circuits and Systems,* 2002). Such a system is not infallible in so much as only the generation of a forbidden state, by injecting faults, is detected and can lead to an alarm.

Finally, it will be noted that the alarm signal itself must generally be protected, to avoid the device being deceived by a direct attack on the alarm signal intended to neutralise the latter.

In summary, none of the means proposed thus far gives total satisfaction, whether in terms of cost or effectiveness, in the fight against attacks on electrical circuits by injecting faults.

The objective of this invention is now to propose new means allowing a more effective fight than the prior art against attempts to attack logic electric circuits by disturbances or fault injection. Moreover, this invention can detect accidental logic faults caused by the circuit environment.

The aforementioned objective is achieved by this invention, using a device forming an electric circuit, characterised by the fact that it comprises logic means generating and using low level signals at intermediate levels between the supply levels of said device and means of detecting the generation of signals outside the range of these low level signals.

Other characteristics, objectives and advantages of the invention will continue to emerge from the description which follows, which is purely for illustration and not limitative, and must be read with the attached drawings in which:

FIG. 1 represents two signals corresponding to high and low logic levels respectively, FIGS. 2, 3 and 4 represent OR, inverter and buffer circuits respectively, in accordance with this invention, FIG. 5 represents a high level detection schema in accordance with this invention, FIGS. 6 and 7 represent the schemas of two circuits in accordance with this invention equipped respectively with means of signal regeneration as input.

Initially, the concept of "low level" signals used in this invention will be explained.

In Boolean algebra, a given bit can take two logic values: 0 or 1. Generally, the logic 0 level sought corresponds to the earth potential of the power supply GND, whereas the logic 1 level corresponds to the positive potential of the power supply VDD.

However, in practice, digital integrated circuits produced based on transistors, for example MOS technology, can generate signals at intermediate levels between these required logic levels GND and VDD.

These intermediate level signals are termed "low level".

This invention, more precisely, uses two low levels: a low 1 level and a low 0 level as illustrated, for example, in the attached FIG. 1, on which the low logic 0 level is intermediate between GND and VDD and, more precisely, close to GND, while being greater than the latter, whereas the low logic 1 level is intermediate between VDD and GND and, more precisely, close to VDD while being less than the latter.

More precisely, with this invention, the inventors propose to use, for example, NMOS transistors to generate a "low 1" level if these NMOS transistors are unsuited to transmitting a perfect logic 1 or VDD. In fact, if a NMOS transistor is capable of transmitting a logic 0 level correctly, it is unsuited to transmitting a logic 1 level as its output cannot achieve the supply voltage VDD in a conventional propagation time. In other words, the output from a NMOS transistor attacked at the input by a logic level or VDD, achieves a level which remains below this supply voltage VDD. This state corresponds to an example of "low logic 1 level" with this invention.

Symmetrically, the inventors are proposing to use, for example, PMOS transistors to generate a "low 0" level if these PMOS transistors are unsuited to sending a perfect logic 0 or GND. Indeed, if a PMOS transistor can send a logic 1 correctly, it is unsuited to sending a perfect logic 0 as its output cannot reach the supply voltage GND in a conventional propagation time. In other words, the output of a PMOS transistor attacked at its input by a logic 0 or GND reaches a level which remains above this GND voltage. This state corresponds to an example of "low logic 0 level" in the context of this invention.

The above considerations are illustrated on the attached FIG. 1, a signal switching between high logic 0 levels or GND, referenced 12, and high logic 1 levels or VDD, referenced 14, is represented in 10, whereas a signal of the type used with this invention, switching between low logic 0 levels, referenced 22, and low logic 1 levels, referenced 24, is represented in 20.

As such, these aforementioned low levels are well known by those skilled in the art. They have already been identified on numerous occasions in the study of logic integrated circuits. They are generally considered as interfering signals which are preferably to be eliminated or corrected, save in very rare cases such as, in particular, in a context of forced surface area optimisation.

Production examples of circuits in accordance with this invention based on NMOS and PMOS transistors, using the concept outlined previously, will now be described with regards to the attached FIGS. 2, 3 and 4. The circuit 30 illustrated in FIG. 2 is designed to operate a logic OR function. The circuit 40, illustrated in FIG. 3, is designed to operate a logic inverter function and the circuit 50, illustrated in FIG. 4, is designed to act as a buffer, i.e. validating low input signal levels corresponding to those received at high levels.

As indicated previously, the transistor layout used is suited to generating and transporting not GND and VDD levels, but intermediate low levels between GND and VDD.

The OR circuit 30 illustrated in FIG. 2 comprises four transistors: two NMOS transistors 31 and 32, in which the drain-source junctions are connected in parallel between the supply pin VDD and a node 33 and in which the grids receive the input bits a and b respectively, and two PMOS transistors 34 and 36, in which the drain-source junctions are connected in series between the aforementioned node 33 and earth GND, and in which the grids also receive the input bits a or b respectively. The output of the circuit on which the logic OR operation for the two inputs a and b is sampled at the node 33.

Those skilled in the art will understand that, for the circuit illustrated in FIG. 2:

1) if the input levels a and b are at high logic 0 level or GND, the NMOS transistors 31 and 32 are blocked, whereas the PMOS transistors 34 and 36 are poor conductors; accordingly, the intermediate node between these two transistors 34 and 36, as well as the output node 33, are placed at a low logic 0 level, 2) if input level a is at high logic 1 level or VDD, whereas input level b is at high logic 0 level or GND, the NMOS transistor 31 is a poor conductor, whereas the NMOS transistor 32 is blocked and the PMOS transistor 34 is blocked whereas the PMOS transistor 36 is a poor conductor; accordingly, the intermediate node between the two transistors 34 and 36 is at low logic 0 level, but the output node 33 is placed at a low logic 1 level, 3) if input level a is at high logic 0 level or GND, whereas input level b is at high logic 1 level or VDD, the NMOS transistor 31 is blocked whereas the NMOS transistor 32 is a poor conductor and the PMOS transistor 34 is a poor conductor whereas the PMOS transistor 36 is blocked; accordingly, the output node 33 is placed at a low logic 1 level, and 4) if the input levels a and b are at high logic 1 level or VDD, the NMOS transistors 31 and 32 are poor conductors, whereas the PMOS transistors 34 and 36 are blocked; accordingly, the output node 33 is placed at a low logic 1 level.

The inverter circuit 40 illustrated in FIG. 3 comprises four transistors: two NMOS transistors 41 and 42, and two PMOS transistors 44 and 46. A NMOS transistor 41 and a PMOS transistor 44 have their drain-source junctions connected in series between the earth GND and output node 43. Similarly, the second NMOS transistor 42 and the second PMOS transistor 46 have their drain-source junctions connected in series between the output node and the supply terminal VDD. The grids of the NMOS transistor 41 and the PMOS transistor 46 receive the input signal a. Those of the PMOS transistor 44 and the NMOS transistor 42 are connected to the earth GND and to the positive supply terminal VDD respectively.

Those skilled in the art will understand that, for the inverter circuit illustrated in FIG. 3:

1) if input level a is at high logic 0 level or GND, the NMOS transistor 41 is blocked, whereas the PMOS transistor 46 applies a high logic 1 level to the NMOS transistor 42 which is then itself a poor conductor; accordingly, the output node 43 is placed at a low logic 1 level, 2) in comparison, if input level a is at high logic 1 level or VDD, the PMOS transistor 46 is blocked, whereas the NMOS transistor 41 applies a high logic 0 level to the PMOS transistor 44 which is then itself a poor conductor; accordingly, the output node 43 is placed at a low logic 0 level.

The circuit 50 illustrated in FIG. 4 comprises two transistors: a NMOS transistor 51 and a PMOS transistor 54 whose drain-source junctions are connected in series between the supply terminal VDD and the earth GND. The output node 53 is sampled at the intermediate point common to the two transistors 51 and 54. The grids of the two transistors NMOS 51 and NMOS 54 receive the input signal a.

Those skilled in the art will understand that, for the circuit illustrated in FIG. 4:

1) if input level a is at high logic 0 level or GND, the NMOS transistor 51 is blocked, whereas the PMOS transistor 54 is a poor conductor; accordingly, the output node 53 is placed at a low logic 0 level, 2) in comparison, if input level a is at high logic 1 level or VDD, the PMOS transistor 54 is blocked, whereas the NMOS transistor 51 is a poor conductor; accordingly, the output node 53 is placed at a low logic 1 level.

It will be noted that each of the circuits in accordance with this invention illustrated in FIGS. 2, 3 and 4 includes at least one NMOS transistor and at least one PMOS transistor. More precisely, each of these circuits includes an identical number of transistors of the NMOS and PMOS type, respectively. The grids of some of these NMOS and PMOS transistors receive symmetrical signals respectively (in FIG. 2, the NMOS transistors 31 and 32, placed in parallel, receive on their grids the input signals a and b respectively, whereas the PMOS transistors 34 and 36 placed in series receive on their grids the input signals a and b respectively; in FIG. 3, the transistors NMOS 42 and PMOS 44 have their grids connected to the positive supply terminal VDD and to the earth GND) or identical (in FIGS. 3 and 4, the transistors NMOS 41 and PMOS 46 and NMOS 51 and PMOS 54 respectively, receive the input signal on their grids). Furthermore, it will be noted that for all these circuits, there is at least one NMOS transistor between the positive supply terminal and the output node and at least one PMOS transistor between the earth and said output node. Moreover, there is a transistor of the NMOS type and a transistor of the PMOS type between each of the inputs and each output node (in FIG. 2, the transistors NMOS 31 and PMOS 34 are placed between the input a and the output node 33, whereas the transistors NMOS 32 and PMOS 36 are placed between the input b and the output node 33; in FIG. 3, the transistor NMOS 41 and the transistor PMOS 46 are placed between the input and the output node 43; in FIG. 4, the transistors NMOS 51 and PMOS 54 are placed between the input and the output node 53).

Of course this invention is not limited to the particular structure of the circuits illustrated in FIGS. 2, 3 and 4. It extends to any other equivalent circuit.

It will be noted that any logic operation can be obtained from a combination of the OR and inverter functions, illustrated in FIGS. 2 and 3. In addition, the gate illustrated in FIG. 4 can be used advantageously as the output for registers of conventional structure, in order to transform high logic levels generated by these registers into low levels.

Quite clearly, this invention can also use registers designed to generate low level signals directly at their outputs.

In the context of this invention, means of detecting signals outside the range of low signals are also provided, in order to generate an alarm at the time of this detection. Thus any logic fault which leads to transforming a low 0 level into a high 0 or to transforming a low 1 level into a high 1 or, more generally, leads to the generation of a high 0 or 1, results in an alarm.

These means of detection can be produced by various methods.

An example of a high level signal detection circuit is illustrated in FIG. 5.

Two cells 60 and 70, adapted to detect a high 0 and a high 1 respectively are to be seen in FIG. 5.

Each of these two cells 60, 70 comprises two transistors 62, 64 and 72, 74 of the NMOS and PMOS types respectively. Each pair of transistors 62, 64 and 72, 74 is placed in series between the earth GND and the positive supply terminal VDD. In the cell 60, the NMOS transistor 62 receives the input signal to be analysed on its grid, whereas the PMOS transistor 64 receives a constant voltage Vch on its grid. Symmetrically in the cell 70, the PMOS transistor 74 receives the input signal to be analysed on its grid, whereas the NMOS transistor 72 receives a constant voltage Vde on its grid. The outputs 63, 73 of the two cells 60 and 70 are sampled at intermediate nodes common to the two pairs of transistors 62, 64 and 72, 74 respectively. The cell 60 generates a logic 1 level as output when the input signal is a high 0 level, and generates a logic 0 level in other cases (i.e. if the input is at a high 1, low 1 or low 0 level). The cell 70 generates a logic 0 level as output when the input signal is a high 1 level, and generates a logic 0 level in other cases (i.e. if the input is at a high 0, low 0 or low 1 level).

Those skilled in the art will know that it is necessary first to size the transistors 62, 64 on one hand and 72, 74 on the other correctly, so that detection should be possible. This sizing and the choice of the values Vch and Vde depends on the technology used. For example, for $0.35\mu$ CMOS technology, with VDD=5V, a possible choice is Vch=3.8V and Vde=0.8V.

As can be seen in FIG. 5, after inverting the output of the cell 60, in an inverter 80, the output of the inverter 80 and the cell 70 are combined in a logic NAND gate 82. Thus the NAND gate delivers a high 1 level signal as soon as a high signal is detected, whether this is a high 1 VDD or a high 0 GND, and the NAND gate delivers a low 0 level signal in other cases.

Accordingly, there is also in FIG. 5 a circuit which includes at least one NMOS transistor and at least one PMOS transistor, more precisely a circuit which includes an identical number of transistors of the NMOS and PMOS types respectively. The grids of some of these NMOS and PMOS transistors receive symmetrical (in FIG. 5, the NMOS transistor 72 receives the Vde signal, whereas the PMOS 64 transistor receives the Vch signal) or identical (in FIG. 5, the NMOS transistor 62 and the PMOS transistor 74 receive the input signal on their grids) signals respectively. Moreover, it will be noted that, for this circuit, there is a PMOS transistor 64, 74 between the positive supply terminal and the output nodes of the cells 60, 70 and a NMOS transistor 62, 72, between the earth and said output nodes. Moreover, there is a transistor 62 of the NMOS type and a transistor 74 of the PMOS type between the input and the output nodes of the cells 60, 70 respectively.

The inventors have also noted that the use of low signals can, however, lead to a degenerescence, i.e. a gradual reduction of the useful signal, if the circuit includes a large number of gates in cascades. Consequently, in order to avoid a risk of non-discrimination between a low 0 and a low 1 or, again, propagation times that are too long, it is desirable to regenerate the signals, at least in certain selected nodes in the circuit. Such a regeneration must be provided at the input to the logic gates, according to integration procedures which bar access to the interface between the regeneration module and the logic gate located downstream, in order to bar any attempt to inject a fault at this level.

In FIG. 6 is illustrated an example of a logic OR gate according to the provisions described previously regarding FIG. 2, but complemented in each of its inputs a and b by a cascade of two logic inverters 90, 92 and 94, 96. The operation of the OR gate remains identical to that described previously.

The inverters 90, 92 and 94, 96, however, guarantee that the OR gate inputs themselves actually receive high level signals, output by the inverters 92 and 96, including the case where the input signals a and b are low level. Of course, the inverters 90, 92 and 94, 96 can be formed from conventional inverters.

In FIG. 7 is illustrated another example of a gate according to this invention equipped with means of regenerating the input signal. Here, this is a gate of the same structure as that described previously with respect to FIG. 2, equipped this time with a single inverter 97, 98 on its inputs a and b. The inverters 97 and 98, which can here again be of conventional configuration, regenerate the input signals a and b at a high level, whatever their initial level. These inverters transform the gate, initially of the OR type, into a gate of the NAND type.

The means of regeneration can take any other appropriate form.

It is true that the structure proposed by this invention can lead, especially when fitted with means of signal regeneration and means of detecting high levels, to a large number of transistors and to a signal propagation time noticeably increased when compared with a conventional circuit. However, it will be noted that the means specific to this invention, using low currents and detecting high currents, can be omitted at any place in the circuit where protection is judged unnecessary. Moreover, if it is not necessary to protect each node, this invention can provide for the dissemination, according to a given or random plan, of only a few gates as specified in this invention in a complex circuit.

According to another advantageous characteristic of this invention, one or more detection structures of the type illustrated in FIG. 5 can be added in a circuit without electrical connection with the rest of the circuit. In this case, the input of each structure is more preferably placed at a constant given potential, for example VDD/2. If there are several of these isolated detection structures, they will more preferably be distributed to cover to best effect in a fairly regular manner a priori the whole of the circuit, even if there may be some influence of randomness. These isolated detection structures do not convey a relevant signal and do not participate in a logic operation. Accordingly, they are not capable of detecting high levels transmitted by a logic gate. They are, however, capable of detecting an injection of a fault, local or over a large area, for example in the form of an attack on a circuit by a laser beam.

Of course this invention is not limited to the particular embodiments which have just been described, but extend to all variants in accordance with its spirit.

This invention can cover numerous applications. As a non-limiting example, the protection of chip cards and other cryptosystems can be cited.

The invention claimed is:

1. An electrical device for forming an electrical circuit, comprising logic means which when operating logic functions generate and use low intermediate level signals between supply levels of said device; and
   means for detecting logic faults in said logic means, said logic faults corresponding to a change of state of an equipotential induced by the environment of the circuit, wherein said logic faults detecting means comprise means for analyzing the signals issued from the logic means and detecting signals outside a range of such low level signals and said logic faults detecting means further comprise means for generating an alarm when signals outside said range of low level signals are detected.

2. Device according to claim 1, wherein the logic means includes NMOS transistors to generate a "low 1" level and PMOS transistors to generate a "low 0" level.

3. Device according to claim 1, wherein the logic means are suited to generating an intermediate low logic 0 level between earth potential (GND) and a positive supply terminal (VDD) and more specifically close to an earth potential while being greater than said earth potential, and an intermediate low logic 1 level between the positive supply terminal (VDD) and earth potential (GND) and, more precisely, close to the positive supply potential (VDD) while being less than said positive supply potential.

4. Device according to claim 1, wherein the device includes an OR circuit which comprises four transistors: two NMOS transistors in which drain-source junctions are connected in parallel between a positive supply terminal (VDD) and an output node and in which grids receive input bits respectively, and two PMOS transistors in which the drain-source junctions are connected in series between the aforementioned output node and earth (GND) and in which the grids also receive the input bits respectively.

5. Device according to claim 1, the device includes an inverter circuit which comprises four transistors: a NMOS transistor and a PMOS transistor having their drain-source junctions connected in series between earth (GND) and an output node, a second NMOS transistor and a second PMOS transistor having their drain-source junctions connected in series between an output node and a positive supply terminal (VDD), the grids of the first NMOS transistor and of the second PMOS transistor receiving input signal (a), whereas those of the first PMOS transistor and the second NMOS transistor are connected to earth (GND) and a positive supply terminal (VDD) respectively.

6. Device according to claim 1, wherein the device includes a buffer circuit which comprises two transistors: a NMOS transistor and a PMOS transistor in which drain-source junctions are connected in series between a positive supply terminal (VDD) and earth (GND), an output node being sampled at an intermediate point common to both transistors and grids of the NMOS transistor and the PMOS transistor receiving input signal.

7. Device according to claim 1, wherein the logic means includes at least one NMOS transistor and at least one PMOS transistor.

8. Device according to claim 1, wherein the logic means includes at least one NMOS transistor between a positive supply terminal and an output node and at least one PMOS transistor between earth and said output node.

9. Device according to claim 1, wherein the logic means includes one transistor of the NMOS type and one transistor of PMOS type between each of the inputs and each output node.

10. Device according to claim 1, wherein the means for detecting signals outside the range of low signals comprise two cells adapted to detect a high 0 and a high 1 and means used to operate a logic combination of the output from these two cells.

11. Device according to claim 10, wherein each of the two cells comprises two transistors of the NMOS and PMOS type respectively.

12. Device according to claim 11, wherein each pair of transistors is placed in series between earth (GND) and the positive supply terminal (VDD).

13. Device according to claim 10, wherein in the cell for detecting a high 0, an NMOS transistor receives an input signal to be analysed on its grid, whereas a PMOS transistor receives a constant voltage on its grid, the output being sampled at an intermediate node common to both transistors.

14. Device according to claim 10, wherein in the cell for detecting a high 1, a PMOS transistor receives an input signal to be analysed on its grid, whereas an NMOS transistor receives a constant voltage on its grid, the output being sampled at the intermediate node common to both transistors.

15. Device according to claim 10, wherein the means used to operate a logic combination of the output from these two cells comprise an inverter placed in the output of one of the two cells and a NAND logic gate which combines the output from the inverter and the output from the other cell.

16. Device according to claim 10, wherein the means for detecting signals outside the range of low signals include a transistor of the NMOS type and a transistor of the PMOS type respectively between the input and the output node of the cells.

17. Device according to claim 1, wherein the means for detecting signals outside the range of low signals include at least one NMOS transistor and at least one PMOS transistor.

18. Device according to claim 1, wherein the means for detecting signals outside the range of low signals include two cells adapted to detect respectively a high 0 and a high 1, each of said two cells comprises a PMOS transistor and an NMOS transistor, said PMOS transistor and NMOS transistor of a cell being connected at a respective output node, and wherein said PMOS transistor is connected between a positive supply terminal and said respective output node and said NMOS transistor between earth and said respective output node.

19. Device according to claim 1, further comprising means of signal regeneration in input to the logic means.

20. Device according to claim 19, wherein the means of signal regeneration comprises at least one inverter positioned at each input to the logic means.

21. Device according to claim 19, wherein the means of signal regeneration comprises two inverters in cascade positioned at each input to the logic means.

22. Device according to claim 1, wherein the device comprises a plurality of the logic means using low signal levels, disseminated according to a given or random schema.

23. Device according to claim 1, wherein the device comprises one or more structures for detecting signals outside the range of low signals, said one or more structures having their input connected to receive a given ratio of a potential supply level.

* * * * *

UNITED STATES PATENT AND TRADEMARK OFFICE
CERTIFICATE OF CORRECTION

PATENT NO. : 8,030,970 B2  
APPLICATION NO. : 11/921527  
DATED : October 4, 2011  
INVENTOR(S) : Loïc Duflot Page 1 of 1

It is certified that error appears in the above-identified patent and that said Letters Patent is hereby corrected as shown below:

On the title page, item [73]
In the Assignee Section, line 1, "reprsenté" should read --représenté--

Signed and Sealed this
Ninth Day of October, 2012

David J. Kappos
*Director of the United States Patent and Trademark Office*